(12) United States Patent
Kaneko et al.

(10) Patent No.: US 6,628,680 B2
(45) Date of Patent: Sep. 30, 2003

(54) PHOTOCONDUCTIVE SWITCH WITH INTEGRAL WAVELENGTH CONVERTER

(75) Inventors: Yasuhisa Kaneko, Kawasaki (JP); Akira Mizuhara, Tama (JP)

(73) Assignee: Agilent Technologies, Inc., Palo Alto, CA (US)

( * ) Notice: Subject to any disclaimer, the term of this patent is extended or adjusted under 35 U.S.C. 154(b) by 146 days.

(21) Appl. No.: 09/861,414

(22) Filed: May 17, 2001

(65) Prior Publication Data

US 2001/0055327 A1 Dec. 27, 2001

(30) Foreign Application Priority Data

May 19, 2000 (JP) ........................................ 2000-149091
Sep. 12, 2000 (JP) ........................................ 2000-276204

(51) Int. Cl.$^7$ ............................................... H01S 3/10
(52) U.S. Cl. .......................... 372/22; 372/23; 257/440; 257/608; 385/16; 430/56
(58) Field of Search ................... 372/22, 23; 250/206; 257/608, 440; 345/76; 385/16; 430/66, 60, 64, 56; 349/116; 354/117

(56) References Cited

U.S. PATENT DOCUMENTS

| | | | | | |
|---|---|---|---|---|---|
| 3,801,825 A | * | 4/1974 | Schwartz et al. | ........... | 250/206 |
| 5,341,390 A | | 8/1994 | Yamada et al. | ............... | 372/45 |
| 5,864,166 A | * | 1/1999 | Stoudt et al. | ............... | 257/608 |
| 6,091,382 A | * | 7/2000 | Shioya et al. | ................. | 345/76 |
| 6,167,170 A | * | 12/2000 | Boffi et al. | .................... | 385/16 |

FOREIGN PATENT DOCUMENTS

| JP | 11112029 A A2 | 4/1999 | ........... | H01L/33/00 |
|---|---|---|---|---|

OTHER PUBLICATIONS

Kamiya, Takeshi et al., "Electrooptic Sampling Using Semiconductor Lasers", Applied Physics, vol. 61, No. 1, 1992, pp. 30–37.
Erlig, H. et al. "LT–GaAs Detector with 451fs Response at 1.55um via Two–Photon Absorption" Electronics Letters, vol. 35, No. 2, Jan. 21, 1999, pp. 173–174.
Ito, H., "InP/InGaAs Uni–Travelling–Carrier Photodoide with 220 Ghz Bandwidth", vol. 35, No. 18, Sep. 1999, pp. 1556–1557.
Kordos, P. et al., "550GHz Bandwidth Photodetector on Low–Temperature Grown Molecular–Beam Epitaxial GaAs", vol. 34, No. 1, Jan. 8, 1998, pp. 119–120.
Warren, Alan et al., "1.30um P–i–N Photodetector Using GaAs with As Precipitates (GaAs:As)" vol. 12, No. 10, Oct. 1991, pp. 527–529.

* cited by examiner

*Primary Examiner*—Albert W. Paladini
(74) *Attorney, Agent, or Firm*—Ian Hardcastle

(57) ABSTRACT

The photoconductive switch comprises a laser that generates light having a first wavelength and a photoconductive switch element arranged to receive the light generated by the laser as incident light. The photoconductive switch element includes a photoconductive layer and a wavelength conversion element. The photoconductive layer has a low absorptivity at the first wavelength. The wavelength conversion element converts the incident light into activating light having a second wavelength at which the photoconductive layer has a greater absorptivity than at the first wavelength. The wavelength conversion element is integral with the photoconductive layer, or is in contact with the photoconductive layer, or is both integral with and in contact with the photoconductive layer.

20 Claims, 6 Drawing Sheets

PHOTOCONDUCTIVE SWITCH WITH INTEGRAL WAVELENGTH CONVERTER

BACKGROUND OF THE INVENTION

Greater capacity has become very important in communication networks in recent years with the increasingly widespread use of the Internet and cellular telephones. One way to achieve greater capacity is to raise the transmission speed. A high-speed optical signal of 160 Gbps has been reported at the research stage.

The increase in transmission speeds dictates higher speed in the measurement devices used to measure transmission signals. Sampling oscilloscopes, which are one way to monitor signal waveforms, incorporate switching elements that are used to sample the signal under test. The current generation of sampling oscilloscopes uses varactor diodes as switching elements. Higher sampling rates are required to be able to monitor higher-frequency signal waveforms, but increasing the switching speed of varactor diodes is difficult.

Another known switching element is the photoconductive switch in which switching is performed by irradiating a semiconductor photoconductive switch element with short pulses of light generated by a high-speed laser. In one example, the semiconductor switching element was composed of GaAs grown at a low temperature of about 200° C.

The optimum wavelength of light for irradiating a semiconductor switching element composed of low-temperature GaAs is about 850 nm. Short pulses of light of this wavelength can be generated by a Ti-sapphire laser or a mode-locked fiber laser whose light output is doubled in frequency by a separate second harmonic generation (SHG) element. Such lasers are capable of generating light with a pulse width as short as about 0.1 ps. However, a Ti-sapphire laser has a number of problems that make it unsuitable for practical use: it is bulky, it requires cooling water and its power output is unstable. A mode-locked fiber laser with a separate SHG element is costly and bulky because of its use of the SHG element.

A mode-locked fiber laser can be fabricated to generate light having a wavelength of about 1.55 $\mu$m. Such a laser is compact, lightweight, and needs no cooling water. Also, the light generated by a mode-locked fiber laser has a highly-stable pulse width, low amplitude noise and low jitter. This light can also have an ultra-short pulse width and a high repetition rate.

However, it is impractical to use the light generated by a mode-locked fiber laser that generates light having a wavelength of 1.55 $\mu$m to control a low-temperature grown GaAs semiconductor switching element because the low-temperature grown GaAs has a low absorptivity at such a long wavelength. Absorption attributable to defects in low-temperature GaAs, and two-photon absorption have been reported for light having a wavelength of 1.55 $\mu$m, but the efficiency of these absorption mechanisms is too low for them to be used in a practical photoconductive switch.

What is needed, therefore, is a photoconductive switch and a semiconductor photoconductive switch element that have a compact, relatively simple construction and that can be controlled by light having a wavelength of about 1.55 $\mu$m.

SUMMARY OF THE INVENTION

The invention provides a photoconductive switch element that comprises a photoconductive layer and a wavelength conversion element. The wavelength conversion element converts incident light having a first wavelength into activating light having a second wavelength at which the photoconductive layer has a greater absorptivity than at the first wavelength. The wavelength conversion element is integral with the photoconductive layer, or is in contact with the photoconductive layer, or is both integral with and in contact with the photoconductive layer.

The wavelength conversion element may include a nonlinear optical material that generates the activating light at the second harmonic of the incident light.

The photoconductive layer and the wavelength conversion element may include a compound semiconductor material, and the compound semiconductor material of at least the wavelength conversion element may have a (100) crystal axis that is tilted by at least 5 degrees relative to the direction of the incident light.

The photoconductive switch element may additionally comprise a substrate of single-crystal (n11) semiconductor material, where n is an integer.

At least the wavelength conversion element may include a layer of the compound semiconductor material grown on the substrate.

The photoconductive switch element may additionally comprise a substrate and at least the photoconductive layer may include an ion-implanted layer in the substrate.

The nonlinear optical material of the wavelength conversion element may be configured as a layer stacked on the photoconductive layer. The nonlinear optical material may be quasi-phase matched.

The nonlinear optical material may be quasi-phase matched, may be sized larger than the photoconductive layer, and may support the photoconductive layer in a location adjacent the end of the nonlinear optical material remote from the end at which the incident light is received.

The wavelength conversion element may include a first major surface via which the incident light is received and a second major surface opposite the first major surface, and the photoconductive layer may be bonded to the second major surface of the wavelength conversion element. The photoconductive layer may include a first major surface bonded to the wavelength conversion element and a second major surface opposite the first major surface, and the photoconductive switch element may additionally comprise electrodes located on the second major surface of the photoconductive layer.

The invention also provides a photoconductive switch that comprises a laser that generates light having a first wavelength and a photoconductive switch element arranged to receive the light generated by the laser as incident light. The photoconductive switch element includes a photoconductive layer and a wavelength conversion element. The photoconductive layer has a low absorptivity at the first wavelength. The wavelength conversion element converts the incident light into activating light having a second wavelength at which the photoconductive layer has a greater absorptivity than at the first wavelength. The wavelength conversion element is integral with the photoconductive layer, or in contact with the photoconductive layer, or both integral with and in contact with the photoconductive layer.

Low-cost lasers capable of generating ultra-short pulses of light generate such light in a wavelength range in which the semiconductor material of the photoconductive layer of a fast photoconductive switch has a low absorptivity. The photoconductive switch and photoconductive switch element according to the invention include a wavelength conversion element integral with the photoconductive layer or in contact with the photoconductive layer. The wavelength conversion element converts the wavelength of the incident light generated by the laser to one at which the semiconductor material of the photoconductive layer has a greater absorptivity than at the wavelength of the incident light. Thus, the invention provides a photoconductive switch and photoconductive switch element controllable by a low-cost laser capable of generating ultra-short pulses of light.

DETAILED DESCRIPTION OF THE INVENTION

Figure 1:
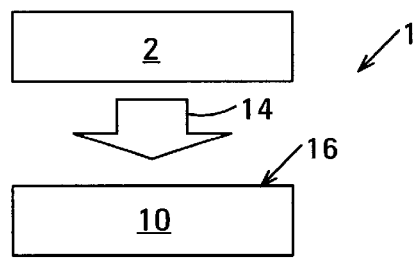
FIG. 1 is a schematic diagram of a photoconductive switch according to the invention.

FIG. 1 is a schematic view of the photoconductive switch 1 according to the invention. The photoconductive switch is composed of the laser 2 and the photoconductive switch element 10. The photoconductive switch element is a semiconductor device. The laser generates the incident light 14 that illuminates the surface 16 of the photoconductive switch element. The laser may generate the incident light in ultra-short pulses. The incident light has a wavelength at which the semiconductor material of the photoconductive switch element has a low absorptivity. The laser and photoconductive switch element are mounted relative to one another such that the incident light impinges substantially perpendicularly on the surface 16 of the photoconductive switch element. This maximizes the fraction of the incident light from the laser that enters the photoconductive switch element, notwithstanding the large difference in refractive index between the semiconductor material of the photoconductive switch element and its surroundings.

Energizing the laser 2 to generate the incident light 14 that illuminates the photoconductive switch element 10 sets the photoconductive switch 1 to its ON state. In the ON state of the photoconductive switch, carriers generated in the photoconductive switch element by the incident light provide electrical conduction between electrodes (e.g., electrodes 18 and 19 shown in FIG. 2A) that form part of the photoconductive switch element. Discontinuing illumination of the photoconductive switch element sets the photoconductive switch to its OFF state in which the electrodes are electrically isolated from one another.

The photoconductive switch element 10 is composed of a photoconductive layer and a wavelength conversion element. The wavelength conversion element converts the incident light into activating light having a wavelength at which the photoconductive layer has a greater absorptivity than at the wavelength of the incident light. In each of the embodiments of the photoconductive switch element described below, the wavelength conversion element is integral with the photoconductive layer, or is in contact with the photoconductive layer, or is both integral with, and in contact with, the photoconductive layer.

Figure 2A:
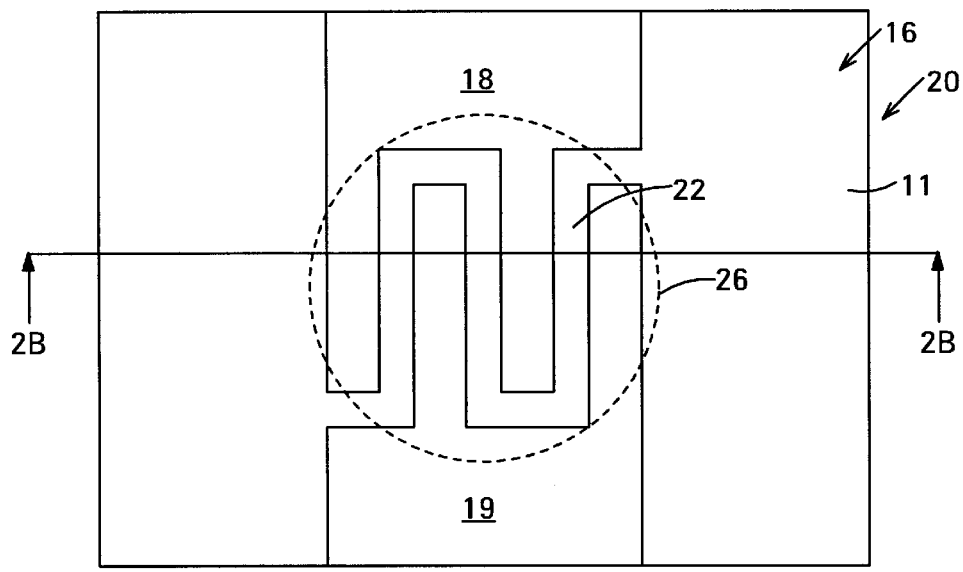
FIG. 2A is a plan view of a first embodiment of a photoconductive switch element according to the invention.
Figure 2B:
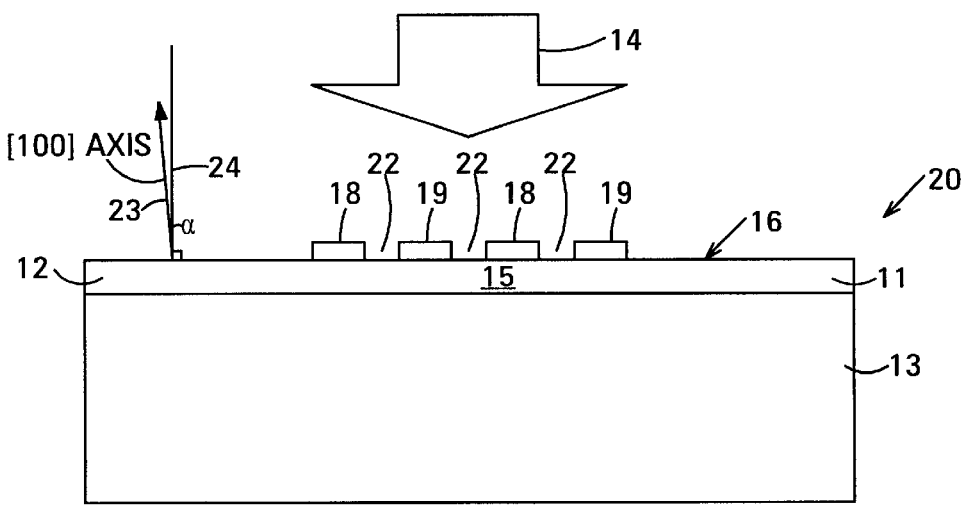
FIG. 2B is a cross-sectional view of the first embodiment of the photoconductive switch element according to the invention taken along the line 2B—2B in FIG. 2A.

FIGS. 2A and 2B show a first embodiment 20 of the photoconductive switch element in a plan view and a cross-sectional view, respectively. The photoconductive switch element 20 can be used as the photoconductive switch element 10 in the photoconductive switch 1 shown in FIG. 1.

The photoconductive switch element 20 is composed of the tilted-axis light-detecting layer 15 supported by the substrate 13. In this embodiment, the tilted-axis light-detecting layer 15 serves as both the photoconductive layer 11 and the wavelength conversion element 12. Thus, in this embodiment, the wavelength conversion element is integral with the photoconductive layer.

The term tilted axis indicates that the (100) crystal axis of the semiconductor material of the tilted-axis light-detecting layer 15 is tilted relative to the perpendicular to the surface of the layer that receives the incident light, and is therefore tilted relative to the direction of the incident light. The tilted (100) crystal axis gives the tilted-axis light-detecting layer 15 its additional wavelength conversion property. Other desirable properties of the material of the tilted-axis light detecting layer 15 are a high optical absorptivity, a high resistivity in the absence of light, and a carrier lifetime that is short compared with the desired switching time of the photoconductive switch 1.

The electrodes 18 and 19, separated by the gap 22, are located on the exposed major surface 16 of the tilted-axis light-detecting layer 15. In an embodiment, the electrodes are interdigitated as shown in FIG. 2A to increase the effective length of the gap and, hence, to reduce the resistance of the photoconductive switch 1 in its ON state.

The incident light 14 impinges substantially perpendicularly on the major surface 16 of the tilted-axis light-detecting layer 15, and illuminates most of the length of the gap 22. The portion of the major surface illuminated by the incident light is shown at 26.

In an embodiment, the material of the tilted-axis light-detecting layer is tilted-axis, low-temperature grown GaAs and the material of the substrate 13 is single-crystal GaAs. The term LTG will be used in this disclosure to indicate low-temperature grown. LTG GaAs is typically formed by epitaxial growth at a substrate temperature of about 200° C., which is substantially lower than the temperature range in which GaAs is conventionally epitaxially grown. LTG GaAs is a single-crystal material, but has a substantially higher density of traps and defects in its crystal structure than the same material grown at a more conventional growth temperature. LTG GaAs has a high resistivity in the absence of light, and a very short carrier lifetime in the sub-picosecond range. LTG GaAs additionally has a high optical absorptivity in a wavelength range extending from the visible to the near infrared. However, the optical absorptivity of LTG GaAs is low at wavelengths of about 1.55 μm, the wavelength of the incident light generated by a typical mode-locked laser.

Conventional photoconductive switch elements that include a photoconductive layer of LTG GaAs supported by a GaAs substrate and that have electrodes located on the major surface of the photoconductive layer are known in the art. The major surface is disposed perpendicular to the incident light. The LTG GaAs of the photoconductive layer has its (100) crystal axis aligned substantially perpendicular to the major surface of the photoconductive layer, and therefore parallel to the direction of the incident light.

A conventional photoconductive switch element operates as follows. The LTG GaAs of the photoconductive layer absorbs a fraction of the incident light by absorption mechanisms that include two-photon absorption and optical absorption involving recombination attributable to defects in the LTG GaAs. Absorbing the incident light generates carriers, i.e., electrons and holes, in the photoconductive layer. The carriers provide electrical conduction between the electrodes. When the incident light is discontinued, the carriers recombine and conduction between the electrodes ceases. Consequently, a photoconductive switch incorporating the conventional photoconductive switch element just described operates as an electrical switch controlled by the incident light.

A photoconductive switch that incorporates a mode-locked fiber laser and the conventional photoconductive switch element just described has a high ON resistance due to the low absorptivity of LTG GaAs at the wavelength of the incident light generated by the laser. Consequently, such a photoconductive switch has inadequate performance for many applications, including the high-speed sampling application described above.

The photoconductive switch element 20 according to the invention incorporates the tilted-axis light-detecting layer 15, which is a layer of a tilted-axis semiconductor such as tilted-axis LTG GaAs. The tilted-axis light-detecting layer serves as both the photoconductive layer 11 and the wavelength conversion element 12. The tilted-axis LTG GaAs layer 15 has its (100) crystal axis 23 tilted relative to the perpendicular 24 to the major surface 16 of the photoconductive layer. Accordingly, the (100) crystal axis is also tilted relative to the direction of the incident light 14. For example, the tilted-axis LTG GaAs layer may have its (n11) crystal axis aligned perpendicular to the major surface 16. This is in contrast to the conventional photoconductive switch element described above in which the (100) crystal axis of the LTG GaAs is aligned perpendicular to the major surface.

The light-detecting layer 15 of tilted-axis LTG GaAs may be formed by using tilted-axis GaAs as the GaAs substrate 13. For example, GaAs having its crystal growth in an (n11) plane rather than the more commonly-used (100) plane can be used as tilted-axis GaAs. Specifically, the tilted-axis GaAs of the substrate 13 may have its crystal growth in the (211) plane or the (011) plane. GaAs is then epitaxially grown on the tilted-axis GaAs substrate with the substrate held at a low temperature, e.g., 200° C. As a result of the orientation of the growth plane of the substrate, the GaAs forms the light-detecting layer 15 by growing epitaxially with its crystal axis oriented substantially in the same direction as that of the tilted-axis substrate, and therefore grows with its (100) crystal axis 23 tilted relative to the perpendicular 24 to its major surface 16. The layer 15 of tilted-axis LTG GaAs has a thickness in the range from about 2 to 4 $\mu$m to provide the characteristics to be described below.

When irradiated with the incident light 14 at an angle of incidence of zero relative to the perpendicular 24 to the major surface 16, the tilted-axis LTG GaAs of the tilted-axis light-detecting layer 15 generates the second harmonic activation light with a wavelength of half of that of the incident light through a process known as second harmonic generation. Second harmonic generation is the result of a nonlinear interaction between the incident light and the GaAs crystal field. For example, when the incident light has a wavelength of approximately 1.55 $\mu$m, which is typical of light generated by a mode-locked fiber laser, the tilted-axis LTG GaAs of the layer 15 generates the second harmonic activation light with a wavelength of approximately 775 nm.

The minimum tilt angle $\alpha$ between the (100) crystal axis 23 of the tilted-axis LTG GaAs of the light-detecting layer 15 and the perpendicular 24 to the major surface 16 is about 5 degrees. When the crystal growth is in the (211) plane or the (011) plane, the (100) crystal axis is tilted at 35° or 90°, respectively, to the perpendicular 24. Because the optical absorptivity of LTG GaAs is considerably greater at a wavelength of about 775 nm than at a wavelength of about 1.55 $\mu$m, the second harmonic generation enables the tilted-axis LTG GaAs of the light-detecting layer 15 effectively to absorb a substantially larger fraction of the 1.55 $\mu$m incident light than conventional (non tilted-axis) LTG GaAs. Thus, the light-detecting layer 15 acting as both the photoconductive layer 11 and the wavelength conversion element 12 provides the photoconductive switch element 20 with a high effective absorptivity for light having a wavelength of about 1.55 $\mu$m. As a result, for a given intensity of the incident light 14, a photoconductive switch incorporating the photoconductive switch element 20 has a substantially lower ON resistance than one incorporating a conventional photoconductive switch element.

The light absorption and carrier generation resulting from converting the incident light into the second harmonic activation light and absorption of the second harmonic activating light is additional to the light absorption and carrier generation resulting from the above-described conventional processes by which the LT GaAs of the light-detecting layer 15 absorbs light at the wavelength of the incident light. Both the activating light and the incident light are absorbed and generate carriers, and the ON resistance of the photoconductive switch is lower than if only one of the absorption mechanisms contributed carriers.

The invention has been described above with reference to an example in which tilted-axis LTG GaAs is used as the tilted-axis light-detecting layer 15. However, this is not critical to the invention. A layer of ion-implanted, tilted-axis semiconductor material can be used as the tilted-axis light-detecting layer 15. A substrate of tilted-axis GaAs having its (100) crystal axis tilted relative to the perpendicular to its major surface, as described above, can be used as the substrate 13. The tilted-axis light-detecting layer can then be formed implanting suitable ions, such as hydrogen ions, via the major surface of the substrate. This forms the tilted-axis light-detecting layer in a region of the substrate that extends into the substrate from the major surface. The implanted ions generate a high density of traps and defects and provide the tilted-axis light-detecting layer with a structure similar to that of the above-described tilted-axis LTG GaAs layer.

Figure 3A:
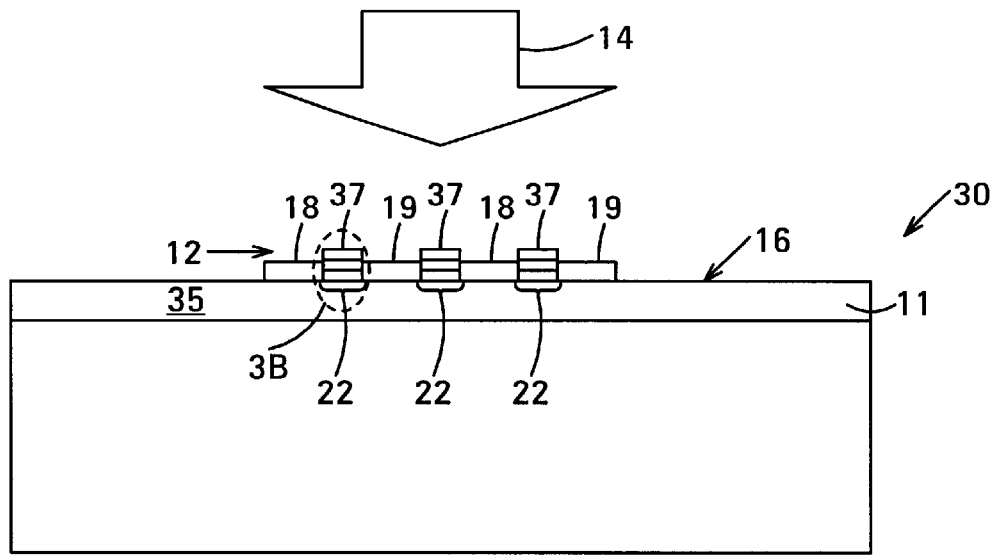
FIG. 3A is a cross-sectional view of a second embodiment of a photoconductive switch element according to the invention
Figure 3B:
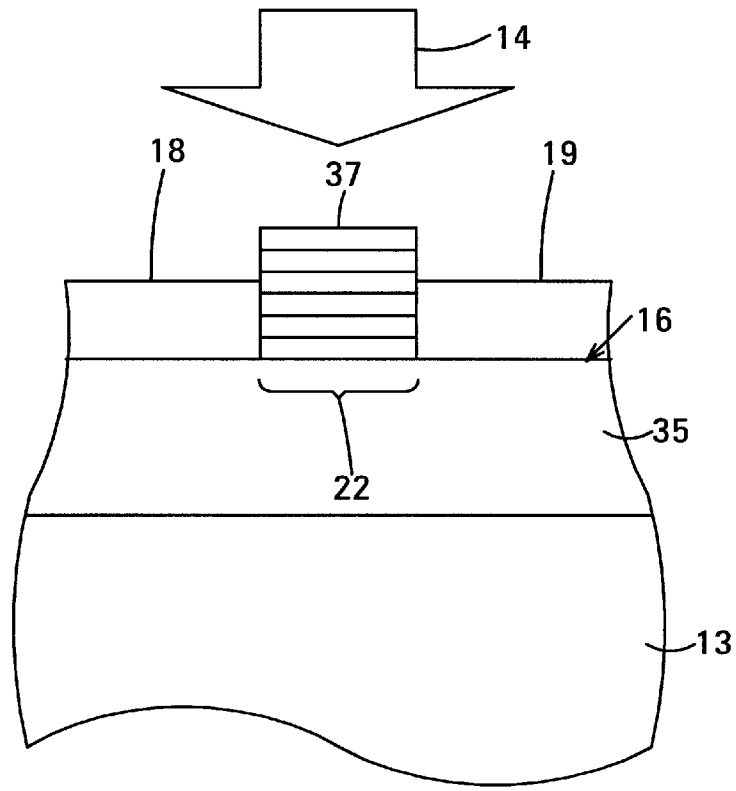
FIG. 3B is an enlarged detail view of the portion 3B indicated in FIG. 3A.

FIGS. 3A and 3B show a second embodiment 30 of a photoconductive switch element according to the invention. The photoconductive switch element 30 can be used as the photoconductive switch element 10 in the photoconductive switch 1 shown in FIG. 1. Elements of the photoconductive switch element 30 that correspond to elements of the photoconductive switch element 20 shown in FIGS. 2A and 2B are indicated using the same reference numerals and will not be described again here. A process that can be used to fabricate the photoconductive switch element 30 will be described below with reference to FIGS. 4A–4C.

The photoconductive switch element 30 is composed of the wavelength converter 37 grown on or bonded to the light-detecting layer 35. The light-detecting layer 35 serves as the photoconductive layer 11 and the wavelength converter 37 serves as at least part of the wavelength conversion element 12. The light-detecting layer may be formed from a tilted-axis semiconductor, in which case, the light-detecting layer 35 additionally serves as part of the wavelength conversion element 12. Thus, in this second embodiment, the wavelength conversion element is in contact with the photoconductive layer, and part of the wavelength conversion element may be integral with the photoconductive layer.

The light-detecting layer 35 is a layer of semiconductor material deposited on the substrate 13. The electrodes 18 and 19 are located on the major surface 16 of the light-detecting layer. The wavelength converter 37 is located in the gap 22 between the electrodes. The wavelength converter 37 generates second harmonic activation light from at least a portion of the incident light 14. The activation light propagates through the wavelength converter to the light-detecting layer 35. The material of the light-detecting layer has a high absorptivity at the wavelength of the activation light. Accordingly, the light-detecting layer absorbs the activation light and generates carriers in response thereto. The carriers set the photoconductive switch that incorporates the photoconductive switch element 30 to its ON state.

The wavelength converter 37 may be sufficiently thin to allow a portion of the incident light 14 that has not converted to activation light to propagate into the light-detecting layer 35. The light-detecting layer absorbs at least part of the unconverted incident light and generates additional carriers in response thereto. The additional carriers contribute to electrical conduction through the photoconductive switch element 30 and lower the ON resistance of a photoconductive switch incorporating the photoconductive switch element 30.

The efficiency with which the additional carriers are generated is low when the material of the light-detecting layer 35 has its (100) crystal axis aligned perpendicular to the major surface 16 since the absorptivity of such material is low at the wavelength of the incident light 14. The efficiency with which the additional carriers are generated is substantially higher when the material of the light-detecting layer is a tilted-axis semiconductor having its (100) crystal axis aligned at 5° or more to the perpendicular to the major surface 16. In this case, the light-detecting layer 35 functions both as the photoconductive layer 11 and as part of the wavelength conversion element 12.

The light-detecting layer 35 is a layer of semiconductor material deposited on the substrate 13. Desirable properties of the semiconductor material of the light-detecting layer 35 are similar to those of the semiconductor material of the light-detecting layer 15, described above. The material of the light-detecting layer may be a tilted-axis semiconductor material when a significant fraction of the incident light passes through the wavelength converter 37 without being converted into the second harmonic activation light. In an embodiment, the light-detecting layer 35 is a layer of tilted-axis LTG GaAs and the substrate is GaAs. The light-detecting layer may be epitaxially grown on, or bonded to, the substrate. Alternatively, the light-detecting layer may be formed by implanting ions into a tilted-axis substrate.

Figure 4A:
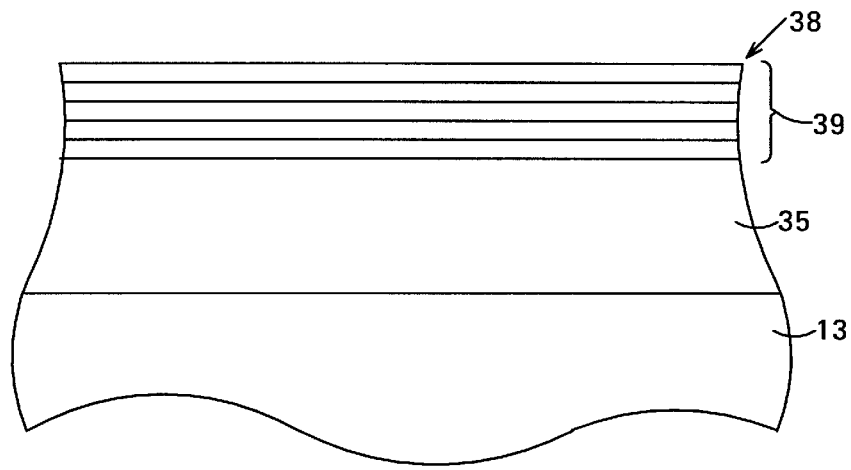
FIGS. 4A–4C are partial cross-sectional views illustrating a process for fabricating the second embodiment of the photoconductive switch element shown in FIG. 3A.

A process that can be used to fabricate the photoconductive switch element 30 will now be described with reference to FIGS. 4A–4C. First, the semiconductor layer structure 38 shown in FIG. 4A is formed. The layer structure is composed of the substrate 13, the light-detecting layer 35 and the wavelength conversion layer 39. In an embodiment, the layer structure is formed by epitaxially growing a layer of LTG GaAs as the light-detecting layer on a substrate 13 of GaAs. Whether the GaAs of the substrate is conventional GaAs or tilted-axis GaAs determines whether the light-detecting layer grows as a conventional light-detecting layer, or as a tilted-axis light-detecting layer, as described above.

The wavelength conversion layer 39 may be grown epitaxially on the light-detecting layer 35 to complete the layer structure 38. The wavelength conversion layer is a quasi-phase matched (QPM) structure composed of multiple pairs of layers of AlGaAs and AlAs, or of AlInP and GaInP. The QPM structure enhances the efficiency of second harmonic generation by reducing destructive interference in the second harmonic light. Instead of growing the wavelength conversion layer epitaxially on the light-detecting layer, whose material has a high density of defects, the wavelength conversion layer may alternatively be formed on a sacrificial layer (not shown) supported by a second substrate (not shown). The layer structure 38 is then formed by bonding the wavelength conversion layer to the light-detecting layer 35. The sacrificial layer is then removed to detach the wavelength conversion layer from the second substrate. The sacrificial layer may be removed by selective etching, for example.

Figure 4B:
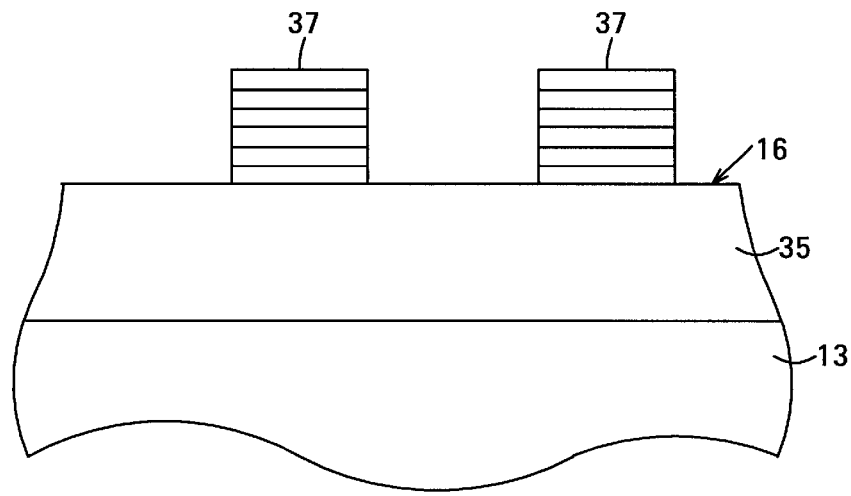
Figure 4C:
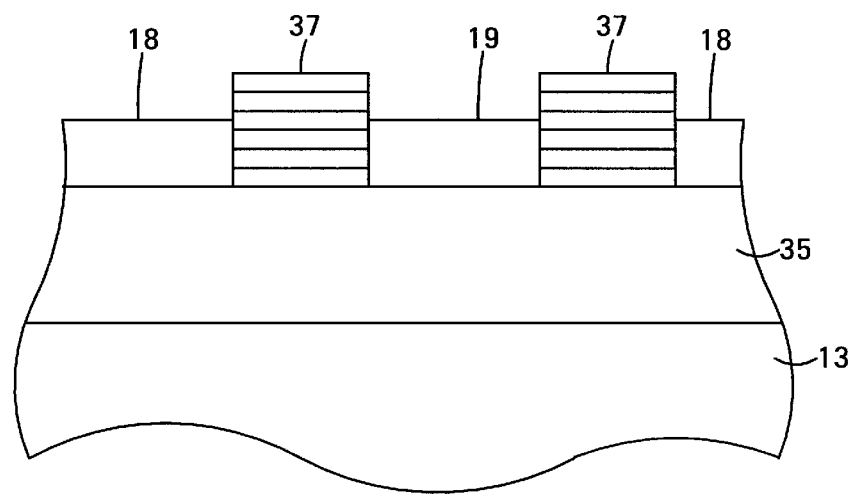

After the layer structure 38 has been formed, the wavelength conversion layer 39 is etched to define the shape of the wavelength converter 37, as shown in FIG. 4B. The etching can be performed using wet etching or reactive ion etching.

After the shape of the wavelength converter 37 has been defined, a layer of metal is deposited on the part of the major surface 16 not occupied by the wavelength converter. The layer of metal can be deposited by a conventional metal layer deposition process. The electrodes 18 and 19 are then defined in the metal layer, as shown in FIG. 4C. This completes fabrication of the photoconductive switch element 30.

Figure 5A:
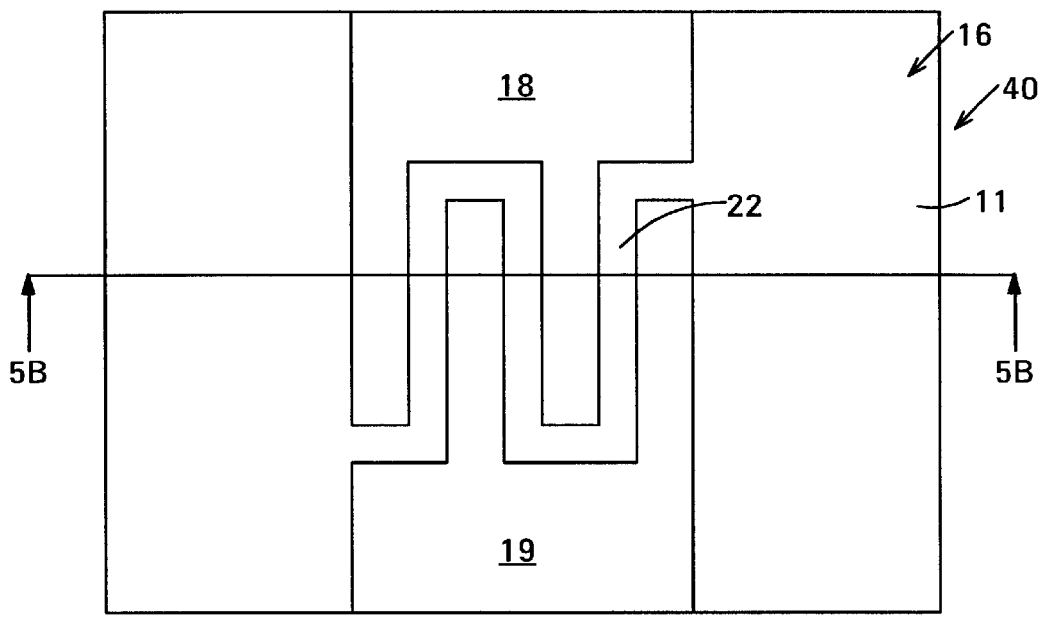
FIG. 5A is a plan view of a third embodiment of a photoconductive switch element according to the invention.
Figure 5B:
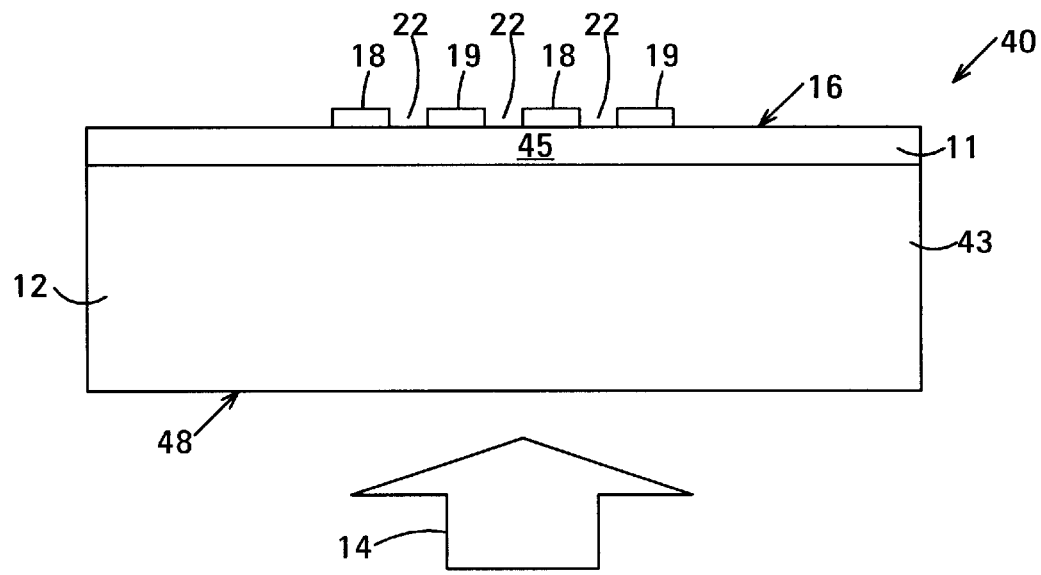
FIG. 5B is a cross-sectional view of the third embodiment of the photoconductive switch element according to the invention taken along the line 5B—5B in FIG. 5A.

FIGS. 5A and 5B shows a third embodiment 40 of a photoconductive switch element according to the invention. The photoconductive switch element 40 can be used as the photoconductive switch element 10 in the photoconductive switch 1 shown in FIG. 1. Elements of the photoconductive switch element 40 that correspond to elements of the photoconductive switch element 20 shown in FIGS. 2A and 2B are indicated using the same reference numerals and will not be described again here. A process that can be used to fabricate the photoconductive switch element 40 will be described below with reference to FIGS. 6A–6D.

The photoconductive switch element 40 is composed of the light-detecting layer 45 bonded to the major surface of the wavelength conversion substrate 43. The light-detecting layer 45 serves as the photoconductive layer 11 and the wavelength conversion substrate 43 serves as at least part of the wavelength conversion element 12. The light-detecting layer may be formed from a tilted-axis semiconductor, in which case, the light-detecting layer additionally serves as part of the wavelength conversion element 12. Thus, in this third embodiment, the wavelength conversion element is in contact with the photoconductive layer, and part of the wavelength conversion element may be integral with the photoconductive layer.

The light-detecting layer 45 is a layer of semiconductor material. Desirable properties of the semiconductor material of the light-detecting layer 45 are similar to those of the semiconductor material of the light-detecting layer 15, described above. The material of the light-detecting layer may be a tilted-axis semiconductor material when the wavelength conversion substrate 43 is sufficiently thin to allow a significant fraction of the incident light to pass through without being converted into the second harmonic activation light. In an embodiment, the light-detecting layer 45 was a layer of tilted-axis LTG GaAs bonded to the wavelength conversion substrate.

The wavelength conversion substrate 43 is fabricated from a crystal of a nonlinear optical material, such as $LiNbO_3$. Alternative nonlinear optical materials that can be used as the wavelength conversion substrate are listed below. The wavelength conversion substrate is cut from the crystal such that the non-linear axis of the crystal is aligned at a specific angle with respect to the major surface 48 through which the incident light 14 is received. This relationship maximizes the second harmonic conversion. The specific angle depends on the material of the wavelength conversion substrate.

Moreover, GaAs wafers having a (100) crystal axis tilted relative to the perpendicular to the major surface of the wafer are available from commercial vendors such as American Crystal Technology, of Dublin, Calif. and Sumitomo Denko of Tokyo, Japan. Such wafers are made by sawing a grown single-crystal ingot at a non-zero angle to the crystal planes. The wavelength conversion substrate 43 can be fabricated from such a wafer. The wafer is bonded to a substrate on which a sacrificial layer and the light-detecting layer 35 have been deposited. The process to be described below with reference to FIGS. 6A–6B may be used to form such a structure.

The electrodes 18 and 19 are located on the major surface 16 of the light-detecting layer 45 remote from the wavelength conversion substrate 43.

As shown in FIG. 5B, the incident light 14 is incident on the major surface 48 of the wavelength conversion substrate 43 remote from the light-detecting layer 45 and the electrodes 18 and 19 are located on the major surface 16 of the light-detecting layer. This arrangement prevents the electrodes from obstructing the passage of light into the wavelength conversion substrate, and from the wavelength conversion substrate to the light-detecting layer. The full beam width of the incident light 14 enters the wavelength conversion substrate instead of only the portion of the beam that passes through the gap 22 between the electrodes. The second harmonic activation light generated by the wavelength conversion substrate from the incident light, together with any unconverted incident light, enter the light-detecting layer 45 through the surface of the light detecting layer remote from the major surface 16 on which the electrodes are located. This increases the number of carriers generated in the light-detecting layer for a given intensity of the incident light 14.

A proportion of the incident light 14 may reach the light-detecting layer 45 without being subject to wavelength conversion. To generate additional carriers from the unconverted incident light, the material of the light-detecting layer is preferably a tilted-axis semiconductor material, such as tilted-axis LTG GaAs, as described above. In this case, the light-detecting layer additionally serves as part of the wavelength conversion element 12.

Figure 6A:
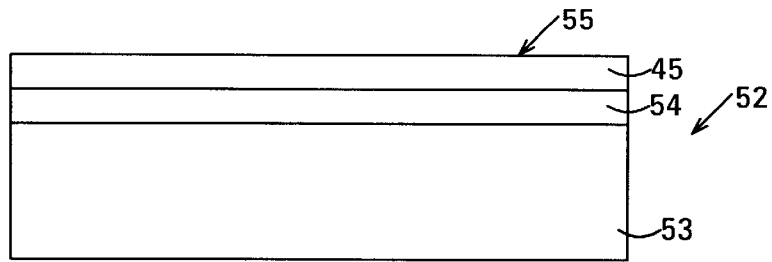
FIGS. 6A–6D are partial cross-sectional views illustrating a process for fabricating the third embodiment of the photoconductive switch element shown in FIG. 5A.

FIGS. 6A–6D illustrate a process that can be used to fabricate the photoconductive switch element 40 shown in FIGS. 5A and 5B. In the process, the layer structure 52 is formed by growing the sacrificial layer 54 and the light-detecting layer 45 on the substrate 53, as shown in FIG. 6A. The sacrificial layer is formed by a conventional thin film deposition process on the surface of the substrate. The light-detecting layer is formed by a conventional thin film deposition process on the surface of the sacrificial layer.

In one embodiment, the material of the substrate 53 is GaAs, the material of the sacrificial layer 54 is AlAs and the material of the light-detecting layer 45 is LTG GaAs. In another embodiment, the materials of the sacrificial layer and the light detecting layer are as just stated, the material of the substrate is tilted-axis GaAs substrate whose major surface is aligned with the (211) growth plane. In this embodiment, the LTG GaAs of the light-detecting layer 45 grows with its (100) crystal axis tilted relative to the perpendicular to its major surface. As a result, the light-detecting layer 45 is a layer of tilted-axis LTG GaAs and has the wavelength conversion properties described above.

Figure 6B:
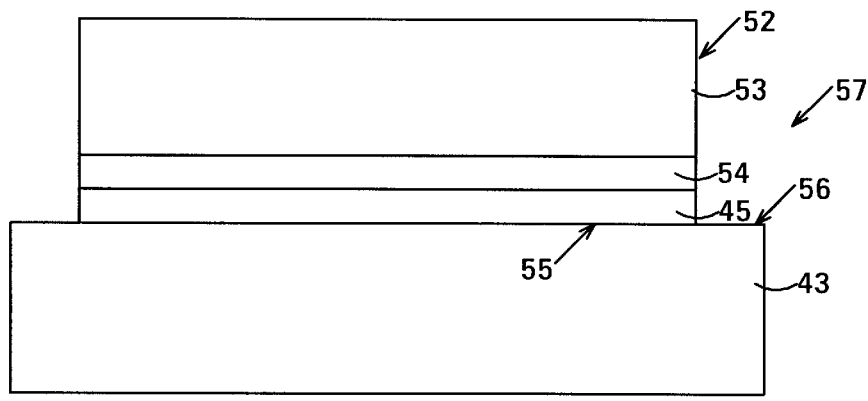
Figure 6C:
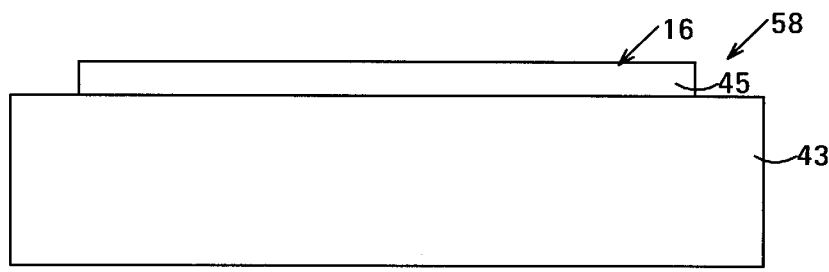

The wavelength conversion substrate 43 is provided. The wavelength conversion substrate is fabricated from a crystal of a nonlinear optical material. In an embodiment, the nonlinear optical material was $LiNbO_3$. The wavelength conversion substrate is cut from a crystal of the nonlinear optical material in a manner that forms a major surface aligned relative to the nonlinear axis of the material at an angle that maximizes the second harmonic conversion of light incident perpendicular to the major surface. The wavelength conversion substrate may alternatively be fabricated from a wafer of GaAs having its (100) crystal axis tilted relative to the perpendicular to the major surface of the wafer, as described above. The layer structure 52 is inverted and its major surface 55 is bonded to the major surface 56 of the wavelength conversion substrate 43, as shown in FIG. 6B. The bonding operation attaches the layer structure 52 to the wavelength conversion substrate 43 to form the assembly 57 in which the light-detecting layer 45 and wavelength conversion substrate 43 are juxtaposed.

The layer structure 52 may be bonded to the wavelength conversion substrate 43 by putting the layer structure and the wavelength conversion substrate together with their major surfaces 55 and 56 juxtaposed, applying pressure, and heating the resulting assembly. The layer structure may alternatively be bonded to the wavelength conversion substrate by coating one or both of the major surfaces 55 and 56 with a bonding material, such as a polyimide, putting the layer structure and the wavelength conversion substrate together with the major surfaces 55 and 56 juxtaposed and heating the resulting assembly. The bonding material is substantially transparent at the wavelength of the activation light, and may additionally be transparent at the wavelength of the incident light.

The sacrificial layer 54 is then removed from the assembly 57 by chemically etching the assembly or by another suitable process. Chemical etching is performed using an etchant that etches the material of the sacrificial layer at a substantially higher rate than it etches the materials of the other components of the assembly. Removing the sacrificial layer also detaches the substrate 53 from the assembly and leaves the two-layer structure 58 shown in FIG. 6C. The two-layer structure is composed of the wavelength conversion substrate 43 and the light-detecting layer 45.

Figure 6D:
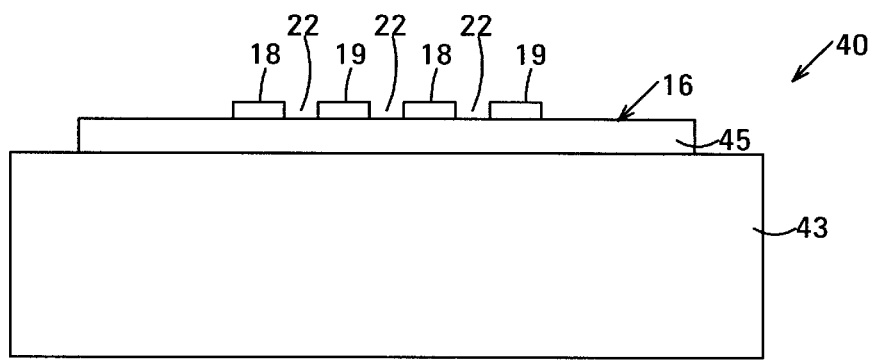

Finally, a layer of metal is deposited on the major surface 16 of the light-detecting layer 45 and is patterned to form the electrodes 18 and 19, and the gap 22, as shown in FIG. 6D. This completes fabrication of the photoconductive switch element 40. The electrode formation just described is performed using a conventional thin-film metal deposition and patterning process.

Figure 7:
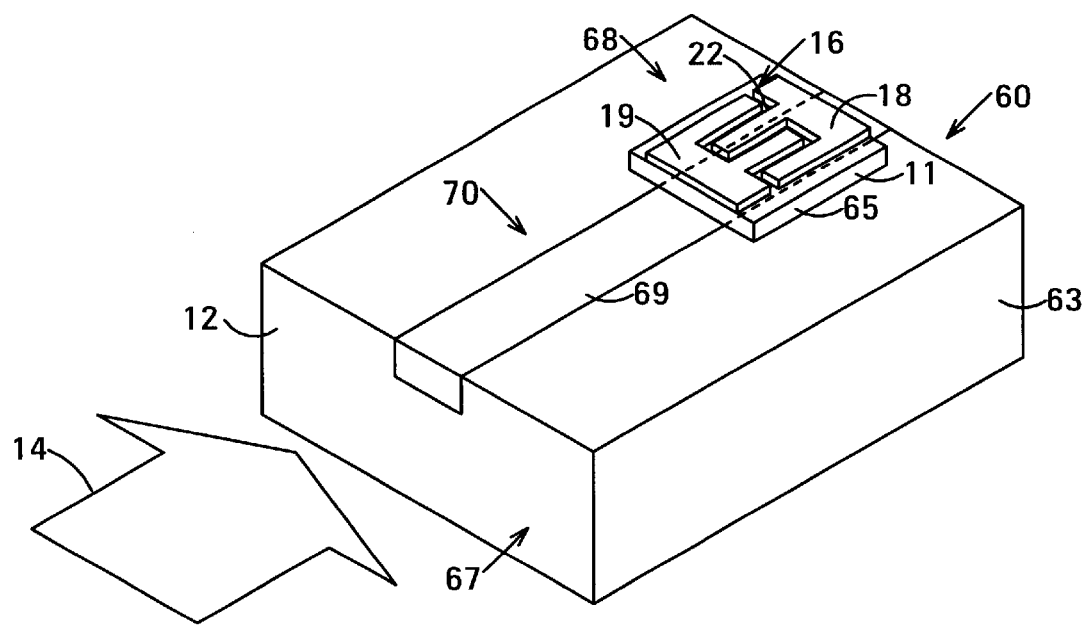
FIG. 7 is a perspective view of a fourth embodiment of a photoconductive switch element according to the invention.

FIG. 7 is an oblique view of a fourth embodiment 60 of a photoconductive switch element according to the invention. The photoconductive switch element 60 can be used as the photoconductive switch element 10 in the photoconductive switch 1 shown in FIG. 1. Elements of the photoconductive switch element 60 that correspond to elements of the photoconductive switch element 20 shown in FIGS. 2A and 2B are indicated using the same reference numerals and will not be described again here.

The photoconductive switch element 60 is composed of the light-detecting layer 65 supported by the wavelength conversion substrate 63. The light-detecting layer is smaller in size than the wavelength conversion substrate and is located on the major surface 68 of the wavelength conversion substrate adjacent the end thereof remote from the end through which the incident light 14 is received. The light-detecting layer 65 serves as the photoconductive layer 11 and the wavelength conversion substrate 63 serves as the wavelength conversion element 12. Thus, in this fourth embodiment, the wavelength conversion element is in contact with the photoconductive layer, and part of the wavelength conversion element may be integral with the photoconductive layer.

The wavelength conversion substrate 63 is fabricated from a crystal of a nonlinear optical material that includes quasi-phase matching structures (not shown). The wavelength conversion substrate includes the optical waveguide core 69. The optical waveguide core and the wavelength conversion substrate collectively constitute the optical waveguide 70. The optical waveguide core is elongate and extends from the surface 67 through the part of the wavelength conversion substrate adjacent the major surface 68. The surface 67 is the surface of the wavelength conversion substrate on which the incident light 14 is received. The optical waveguide core may be formed by diffusing or implanting a suitable impurity into the waveguide conversion substrate.

The light-detecting layer 65 is located on the major surface 68 of the wavelength conversion substrate 63. The light-detecting layer is located closer to the end of the wavelength conversion substrate remote from the surface 67 on which incident light 14 is received. The light-detecting layer is additionally located to overlap part of the optical waveguide core 69. The different refractive index of the material of the light-detecting layer juxtaposed with the optical waveguide core modifies the light-guiding properties of the part of the optical waveguide 70 overlapped by the light-detecting layer.

The electrodes 18 and 19 are located on the major surface 16 of the light-detecting layer 65. The major surface 16 is opposite the major surface of the light-detecting layer that contacts the wavelength conversion substrate 63. Activation light generated in the wavelength conversion substrate enters the light-detecting layer unobstructed by the electrodes.

The optical waveguide 70 guides the incident light 14 through the wavelength conversion substrate 63. In the course of passing through the wavelength conversion substrate, a substantial proportion of the incident light is converted into second harmonic activation light. The second harmonic activation light is also guided by the optical waveguide. The quasi phase-matching structure of the wavelength conversion substrate enhances the efficiency with which the wavelength conversion substrate generates the activation light.

The second harmonic activation light can escape laterally from the part of the optical waveguide 70 overlapped by the light-detecting layer 65. At least part of the second harmonic activation light that escapes from the optical waveguide enters the light-detecting layer. The light-detecting layer has a relatively high absorptivity at the wavelength of the second harmonic activation light. Absorption of second harmonic activation light by the light-detecting layer generates carriers that provide electrical conduction between the electrodes 18 and 19. Unconverted incident light can also enter the light-detecting layer from the optical waveguide and can generate additional carriers.

In an embodiment, the material of wavelength conversion substrate 63 was a portion of a crystal of lithium niobate (LiNbO$_3$), and the material of the light-detecting layer 65 was LTG GaAs. Suitable alternative nonlinear optical materials that can be used as the material of the wavelength conversion substrate include In$_x$Ga$_{1-x}$As$_y$N$_{1-y}$, in which $0 \leq x \leq 1$, $0 \leq y \leq 1$; In$_x$Ga$_{1-x}$As$_y$P$_{1-1}$, in which $0 \leq x \leq 1$, $0 \leq y \leq 1$; LiTaO$_3$; KNbO$_3$; KTiO$_3$; K$_2$H$_2$PO$_4$; beta-BaB$_2$O$_4$, ZnSe, GaP, InP, ZnS and tilted-axis GaAs. The wavelength conversion substrate is cut from the crystal of the nonlinear optical material in a manner that forms the surface 67 aligned relative to the non-linear axis of the nonlinear optical material at a specific angle that maximizes the second harmonic conversion of light incident perpendicularly on the surface 67. The specific angle depends on the material of the wavelength conversion substrate. For example, the surface 67 may be aligned with the c-face of the LiNbO$_3$ crystal to increase the second harmonic conversion. The alternative nonlinear optical materials can also be used as the material of the wavelength conversion substrate 43 of the embodiment shown in FIG. 5A.

Suitable alternative materials for the light-detecting layer 65 include In$_x$Ga$_{1-x}$As$_y$N$_{1-y}$, in which $0 \leq x \leq 0.3$, $0.8 \leq y \leq 1$; In$_x$Ga$_{1-x}$As$_y$P$_{1-y}$, in which $0 \leq x \leq 1$, $0 \leq y \leq 1$; Zn$_x$Cd$_{1-x}$S$_y$Se$_{1-y}$, in which $0 \leq x \leq 1$, $0 \leq y \leq 1$; and Si$_x$Ge$_{1-x}$, in which $0.5 \leq x$. The alternative materials can also be substituted for LTG GaAs in the light-detecting layers of the photoconductive switch elements 20, 30 and 40 described above. In all embodiments, one or more of low-temperature growth, ion implantation and impurity doping may be performed on the above materials to enhance the light-detecting characteristics of the light-detecting layer formed from them.

In the photoconductive switch element 40, the light-detecting layer 65 can be deposited on part of the wavelength conversion substrate 63 using a conventional thin-film deposition process. In particular, it is relatively easy to deposit a light-detecting layer of GaAs on a wavelength conversion substrate of ZnSe. Alternatively, the light-detecting layer can be fabricated on a second substrate, as described above, and can then be bonded to the wavelength conversion substrate 63 using a bonding process, such as one of the bonding processes described above with reference to FIGS. 6A–6D. The light-detecting layer fabricated on a second substrate can additionally be fabricated with a tilted axis, as described above, to give it a wavelength conversion property.

Although this disclosure describes illustrative embodiments of the invention in detail, it is to be understood that the invention is not limited to the precise embodiments described, and that various modifications may be practiced within the scope of the invention defined by the appended claims.

We claim:

1. A photoconductive switch element, comprising:
   a photoconductive layer; and
   wavelength conversion means for converting incident light having a first wavelength into activating light having a second wavelength at which the photoconductive layer has a greater absorptivity than at the first wavelength, the wavelength conversion means being at least one of (a) integral with the photoconductive layer, and (b) in contact with the photoconductive layer.

2. The photoconductive switch element of claim 1, in which the wavelength conversion means includes a nonlinear optical material that generates the activating light at a second harmonic of the incident light.

3. The photoconductive switch element of claim 2, in which the photoconductive layer and the wavelength conversion means include a compound semiconductor material.

4. The photoconductive switch element of claim 3, in which the compound semiconductor material of at least the wavelength conversion means has a (100) crystal axis tilted by at least 5 degrees relative to a direction of the incident light.

5. The photoconductive switch element of claim 3, in which:
   the photoconductive switch additionally comprises a substrate of single-crystal (n11) semiconductor material, where n is an integer; and
   at least the wavelength conversion means includes a layer of the compound semiconductor material grown on the substrate.

6. The photoconductive switch element of claim 2, in which:
   the photoconductive switch element additionally comprises a substrate; and
   at least the photoconductive layer includes an ion-implanted layer in the substrate.

7. The photoconductive switch element of claim 2, in which the wavelength conversion means is integral with the photoconductive layer.

8. The photoconductive switch element of claim 2, in which the nonlinear optical material is configured as a layer stacked on the photoconductive layer.

9. The photoconductive switch element of claim 8, in which the nonlinear optical material is quasi-phase matched.

10. The photoconductive switch element of claim 2, in which:
    the nonlinear optical material is quasi-phase matched and is sized larger than the photoconductive layer; and
    the photoconductive layer is supported by the nonlinear optical material and is located adjacent an end of the nonlinear optical material remote from an end at which the incident light is received.

11. The photoconductive switch element of claim 2, in which the photoconductive layer and the wavelength conversion means are bonded to one another.

12. The photoconductive switch element of claim 2, in which the nonlinear optical material comprises oxygen.

13. The photoconductive switch element of claim 12, in which:
    the wavelength conversion means includes a first major surface via which the incident light is received and a second major surface opposite the first major surface; and
    the photoconductive layer is bonded to the second major surface of the wavelength conversion means.

14. The photoconductive switch element of claim 13, in which:
    the photoconductive layer includes a first major surface bonded to the wavelength conversion means and a second major surface opposite the first major surface; and
    the photoconductive switch element additionally comprises electrodes located on the second major surface of the photoconductive layer.

15. The photoconductive switch element of claim 2, in which the photoconductive layer and the wavelength conversion are bonded to one another by a transparent adhesive material.

16. The photoconductive switch element of claim 2, in which the photoconductive layer includes a material selected from the group consisting of: $In_xGa_{1-x}As_yN_{1-y}$, in which $0 \leq x \leq 0.3$, $0.8 \leq y \leq 1$; $In_xGa_{1-x}As_yP_{1-y}$, in which $0 \leq x \leq 1$, $0 \leq y \leq 1$; $Zn_xCd_{1-x}S_ySe_{1-y}$, in which $0 \leq x \leq, 1, 0 \leq y \leq 1$; and $Si_xGe_{1-x}$, in which $0.5 \leq x$.

17. The photoconductive switch element of claim 2, in which the nonlinear optical material is selected from the group consisting of $In_xGa_{1-x}As_yN_{1-y}$, in which $0 \leq x \leq 1$, $0 \leq y \leq 1$; $In_xGa_{1-x}As_yP_{1-y}$, in which $0 \leq x \leq 1$, $0 \leq y \leq 1$; $LiNbO_3$; $LiTaO_3$; $KNbO_3$; $KTiO_3$; $K_2H_2PO_4$; beta-$BaB_2O_4$; ZnSe, GaP, InP, ZnS and tilted-axis GaAs.

18. A photoconductive switch, comprising:
    a laser that generates light having a first wavelength; and
    a photoconductive switch element arranged to receive the light generated by the laser as incident light, the photoconductive switch element including:
       a photoconductive layer having a low absorptivity at the first wavelength, and
       wavelength conversion means for converting the incident light into activating light having a second wavelength at which the photoconductive layer has a greater absorptivity than at the first wavelength, the wavelength conversion means being at least one of (a) integral with the photoconductive layer, and (b) in contact with the photoconductive layer.

19. The photoconductive switch of claim 18, in which the wavelength conversion means includes a nonlinear optical material that generates the activating light at a second harmonic of the incident light.

20. The photoconductive switch of claim 18, in which at least the wavelength conversion means includes a compound semiconductor material having a (100) crystal axis tilted by at least 5 degrees relative to a direction of the incident light.

* * * * *